United States Patent [19]

Hamagawa

[11] 4,131,855

[45] Dec. 26, 1978

[54] DIGITAL TIME SIGNALLING DEVICE

[75] Inventor: Hiroshi Hamagawa, Himeji, Japan

[73] Assignee: Toyo Jihoki Manufacturing Co., Ltd., Japan

[21] Appl. No.: 821,482

[22] Filed: Aug. 3, 1977

[51] Int. Cl.[2] .......... H03K 5/13

[52] U.S. Cl. .......... 328/129; 328/37; 328/48; 58/85.5

[58] Field of Search .......... 328/129, 130, 37, 48; 307/293; 58/85.5

[56] References Cited

U.S. PATENT DOCUMENTS

| | | | |
|---|---|---|---|
| 3,657,658 | 4/1972 | Kubo | 328/130 X |
| 3,909,620 | 9/1975 | Matsuda et al. | 307/293 |
| 3,979,681 | 9/1976 | Arnold | 328/48 |
| 4,001,699 | 1/1977 | Denny et al. | 328/48 X |
| 4,080,575 | 3/1978 | Miki | 328/129 |

*Primary Examiner*—John S. Heyman
*Attorney, Agent, or Firm*—Eugene E. Geoffrey, Jr.

[57] ABSTRACT

A digital time signalling device which includes an oscillator and frequency divider producing clock pulses at a given frequency, a counter for counting clock pulses to produce minute pulses, a counter for counting minute pulses to produce hour pulses, an hour counter for counting hours, a time setting unit and a coincidence circuit for comparing the outputs of the hour and minute counters with the output of the time setting unit to produce a coincidence signal activating a utilization device.

6 Claims, 2 Drawing Figures

DIGITAL TIME SIGNALLING DEVICE

Figure 1:
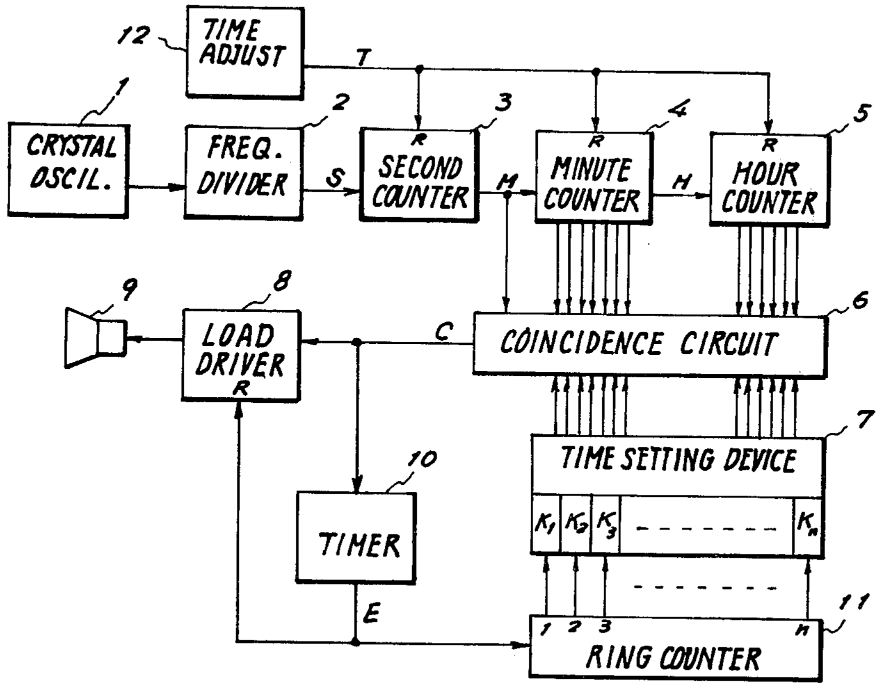

This invention relates to a digital time singalling device, especially to a digital time signalling device of statically driven type.

Instead of a mechanical time signalling device provided with a time setting disc, which had been used since olden times, an electronic digital device, such as described in U.S. Pat. No. 3,909,620, has been developed recently. This device, which is arranged to compare an actual time signal produced from an electronic standard clock device with a preset time signal successively in dynamic fashion at every digit of the time signals under control of separately prepared timing signals, has obtained much higher accuracy and reliability than the prior mechanical time signalling device. However, it has had some undesirable features such as unavoidable time lag in time signalling and low noise immunity.

Accordingly, an object of this invention is to provide an improved time signalling device having no time lag in time signalling but high noise immunity.

This object can be fully attained by the device of this invention, which comprises a pulse oscillator for generating a pulse output having a constant frequency, a frequency divider circuit for dividing the output of the oscillator to produce clock pulses of one Hertz frequency, a second counter for counting the clock pulses to produce minute pulses at intervals of sixty counts, a minute counter for counting the minute pulses to produce hour pulses at intervals of sixty counts, an hour counter for counting the hour pulses, a time setting unit for setting a time to be signalled, a coincidence circuit for comparing the count outputs of the minute and hour counters with the output of the time setting unit for all bits at the same time to produce a coincidence signal when coincidence is obtained, and a load driving unit energized by the coincidence signal for driving utilization devices.

Other objects and features of this invention will be described in more detail hereinunder with reference to the accompanying drawings.

Figure 2:
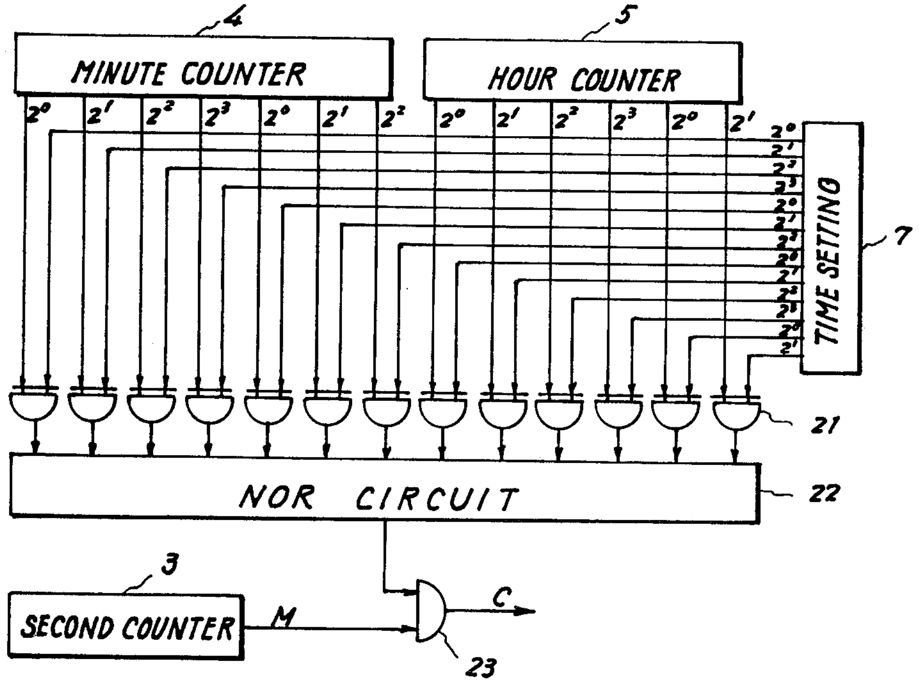

In the drawings:

FIG. 1 is a block circuit diagram representing an embodiment of the device of this invention; and FIG. 2 is a logic circuit diagram representing an example of circuit configuration of the coincidence circuit of FIG. 1.

Throughout the drawings, the same reference numerals and symbols are given to corresponding components.

Referring to FIG. 1, the device comprises a crystal oscillator 1 which produces high frequency oscillation voltage of 4.194304 megahertz, for example, a frequency divider circuit 2 which divides this high frequency through twenty-two stages, for example, to produce reference frequency pulses S of one Hertz, a second counter 3 which counts the pulses S to produce output pulses M at intervals of sixty counts, a minute counter 4 which counts the pulses M to produce a count output in binary-coded decimal code and also produce output pulses H and be concurrently reset at intervals of sixty counts, and an hour counter 5 which counts the pulses H to produce a count output in binary-coded decimal code and also to be reset at intervals of twenty-four counts. The count outputs of the minute counter 4 and hour counter 5 are supplied to a coincidence circuit 6, which will be described later, and compared with a binary-coded decimal code representing a preset time, which is supplied from a time setting device 7, for all bits at the same time, and the coincidence circuit 6 produces a coincidence pulse C when coincidence is obtained therebetween.

The coincidence pulse C from the coincidence circuit 6 is supplied to a load driver circuit 8 to energize the same and the latter drives a signalling device 9 such as siren. The coincidence circuit C is also supplied to a timer unit 10 to initiate its operation. The timer unit 10 produces an end pulse E when a preset time has expired. The end pulse E is applied to a reset terminal R of the load driver circuit 8 to de-energize it and to stop operation of the signalling device 9.

The time setting device 7 includes setting units $K_1$, $K_2$, ... $K_n$, which are provided with individual or common time setting keys or dials and actuated by a driving input from a ring counter 11 to supply a binary-coded decimal code representing a time to be signalled which is stored therein to the coincidence circuit 6.

The end pulses E from the timer unit 10 is also supplied to and counted by the ring counter 11 and the ring counter 11 produces its count output pulses from its n terminals 1, 2, ... n sequentially. The n output terminals 1, 2, ... n are respectively connected to the setting units $K_1$, $K_2$, ... $K_n$ of the time setting device 7 for actuating the corresponding units and, preferably, indicating the actuated unit with a pilot lamp or the like. The actuated unit is deactuated by the next end pulse E.

This device is provided with a time adjusting device 12 for setting its clock system by the standard time. The adjusting device 12 includes, for example, a known time detecting unit which detects a public radio time signal of "$0^h00^m00^s$" (just midnight) for example and produces a reset pulse T which is then applied to reset terminals R of the second, minute and hour counters 3, 4 and 5, respectively, to reset the counting operation of these counters at the same time. Consequently, thereafter, the count outputs of these counters represent accurately the standard time. The adjusting device 12 may be a suitable voltage source provided with a push-button temporary switch and the operator may push the switch in response to an auditorily or visually sensed time signal to manually produce the reset pulse T.

FIG. 2 shows an example of configuration of the coincidence circuit 6. The coincidence circuit comprises thirteen exclusive OR gates 21, a NOR circuit 22 and an AND gate 23. The respective bits of the binary-coded decimal code outputs of the minute and hour counters 4 and 5 are connected to one input of the exclusive OR gates 21 and the respective bits of the binary-coded decimal code output of the time setting device 7 are also connected to the other inputs of the corresponding exclusive OR gates 21. The outputs of the all exclusive OR gates 21 are supplied to the NOR circuit 22 as its inputs and the output of the NOR circuit 22 is connected to one input of the AND gate 23 the other input of which is supplied with the output pulses M of the second counter 3.

As each exclusive OR gate 21 produces "0" output when both inputs coincide with each other, the outputs of all exclusive OR gates 21 become "0" when coincidence is obtained for the bits, that is, "o'clock" and "minute" of the actual time and the preset time coincide completely. As the NOR circuit 22 produces "1" output only when all inputs are "0", the output of the NOR circuit 22 beomces "1" only when the above coincidence is obtained. Accordingly, the duration of this output is one minute. The output pulses M of the second counter 3 represents the time just before counted by the minute counter 4, that is, the zero second of each "minute". Therefore, the AND gate 23, whose inputs are the pulses M and the output of the NOR circuit 22, confines the above duration to the duration of the pulse M (below one second). Consequently, the duration of the coincidence output becomes below one second.

Although the time signalling can become accurate to the order of "second" if it is arranged that the time can be set in the time setting device 7 to the order of "second" and the count output of the second counter 3 is also derived for comparison in the coincidence circuit 6, the time signal accurate to the order of "minute" will be sufficient for conventional use. However, it should be noted that the maximum error in the time signal of this "minute" unit is one second but not one minute.

The time setting device 7 may be an input device provided with key board, memory, encoder and the like, which is generally used in arithmetic units. The times to be signalled must be set sequentially in the units $K_1, K_2, \ldots K_n$ in the order of time lapse, and no time is detected if set in inverted order. The load driver circuit 8 can be constituted in any way, including power source, relay, amplifer, oscillator and the like, in compliance with the use of its output. Although, in the above description, the signalling device 9 was used as a utilization device, it is not limited to visual and audible signals but may be an equipment of different kind such as to be operated from a predetermined time. The timer unit 10 may be a known one of digital or analog type and mechanical type may be used also if the required accuracy is not so critical.

Although the above embodiment was described as including the time setting device 7 having a plurality of setting units, the device is, of course, included in the scope of this invention even if it includes only one setting unit. In the latter case, the ring counter 11 can be omitted. Instead of the end pulse E, the coincidence pulse C may be used as the input of the ring counter 11. In this case, it is possible to omit the timer unit 10 and reset the load driving circuit 8 in manual operation.

Although a binary-coded decimal code system is adopted in the above embodiment, it is a matter of course that any code system such as pure binary and others can be adopted as occasion demands.

What is claimed is:

1. A digital time signalling device comprising a pulse generating circuit for generating clock pulses of one Hertz frequency, a first counter for counting said clock pulses to produce output pulses at intervals of sixty (60) counts, a second counter for counting the output pulses of said first counter to produce a coded count output every count and also produce output pulses at intervals of sixty (60) counts and being reset in response to said output pulses, a third counter for counting the output pulses of said second counter to produce a coded count output every count and being reset at intervals of twenty-four (24) counts, a time setting device for storing a time to be signalled and producing a coded output representing said time, a coincidence circuit for comparing the coded count outputs of said second and third counters with the coded output of said time setting device for all bits at the same time and producing a coincidence signal when coincidence is obtained therebetween, and a load driving device energized by said coincidence signal to drive a utilization device.

2. A digital time signalling device, according to claim 1, wherein said device further comprises a ring counter for counting pulses produced in response to said coincidence signal, and said time setting device includes a plurality of time setting units actuated sequentially by type output of said ring counter.

3. A digital time signalling device, according to claim 2, wherein said load driving device is provided with a time device which starts operation in response to said coincidence signal and producing an end signal for stopping said operation after a lapse of predetermined time, and said end signal is coupled to the input of said ring counter.

4. A digital time signalling device, according to claim 1, wherein said device further comprises a time adjusting device for producing a signal for resetting said first, second and third counters in response to a standard time signal.

5. A digital time signalling device, according to claim 4, wherein said time adjusting device includes a time signal detector for detecting a radio time signal to produce a detection output.

6. A digital time signalling device, according to claim 4, wherein said time adjusting device is a manually operated pulse generating device.

* * * * *